United States Patent [19]

Arvanitis

[11] Patent Number: 5,369,382
[45] Date of Patent: Nov. 29, 1994

[54] TWO-POLE MONOLITHIC CRYSTAL FILTER INCLUDING SHUNT RESONATOR STAGES

[75] Inventor: Aristotelis Arvanitis, Addison, Ill.

[73] Assignee: Motorola, Inc., Schaumburg, Ill.

[21] Appl. No.: 66,811

[22] Filed: May 24, 1993

[51] Int. Cl.[5] ............................................. H03H 9/00
[52] U.S. Cl. ..................................... 333/189; 310/365
[58] Field of Search ............................ 333/187–192; 310/320, 365, 366

[56] References Cited

U.S. PATENT DOCUMENTS

| | | | |
|---|---|---|---|
| 3,838,366 | 10/1974 | Coussot | 333/192 |
| 4,013,982 | 3/1977 | Wood et al. | 333/192 |
| 4,287,493 | 9/1981 | Masaie | 333/191 |
| 4,329,666 | 5/1982 | Arvanitis | 333/191 |
| 4,625,138 | 11/1986 | Ballato | 310/320 |

Primary Examiner—Robert J. Pascal
Assistant Examiner—Darios Gambino
Attorney, Agent, or Firm—Gary J. Cunningham; Joseph P. Krause

[57] ABSTRACT

A two-pole monolithic piezoelectric filter (50) provides an improved frequency response at specified frequencies above the center frequency of a two-pole filter; at these frequencies the frequency response exceeds the attenuation of a four-pole filter without any increase in space, volume, or cost by the inclusion of additional resonator stages (64 and 68) formed into the substrate (52). Appropriate selection of the dimensions of these resonator stages can be used to adjust the frequency at which these resonator stages provide additional desired attenuation.

6 Claims, 3 Drawing Sheets

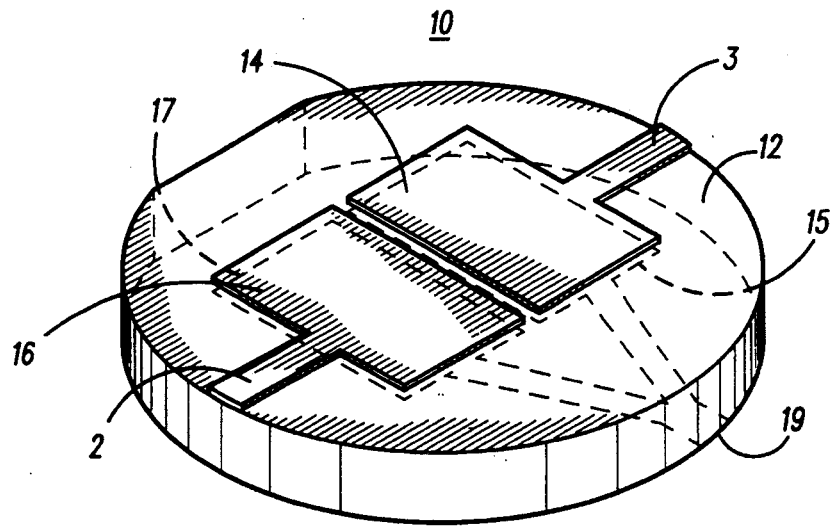
FIG.1 −PRIOR ART−
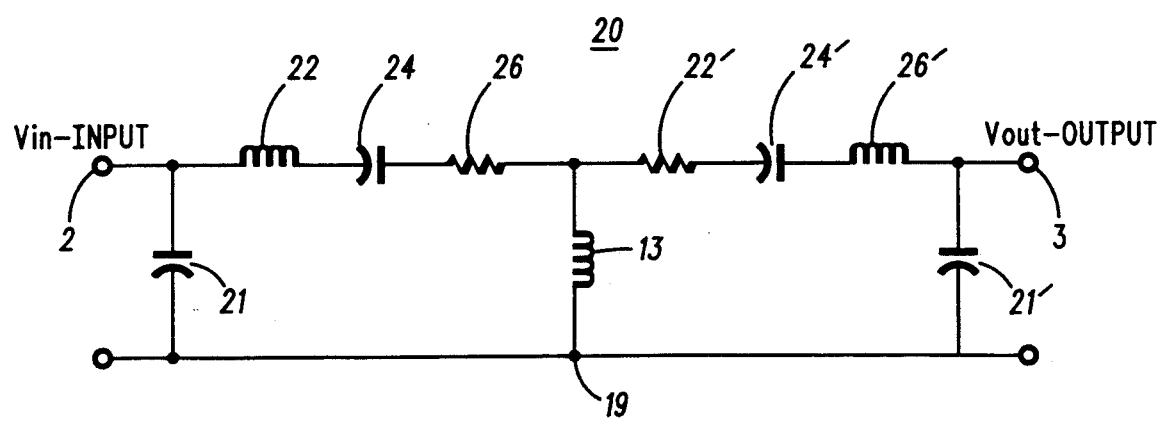
FIG.2 −PRIOR ART−

FIG. 4
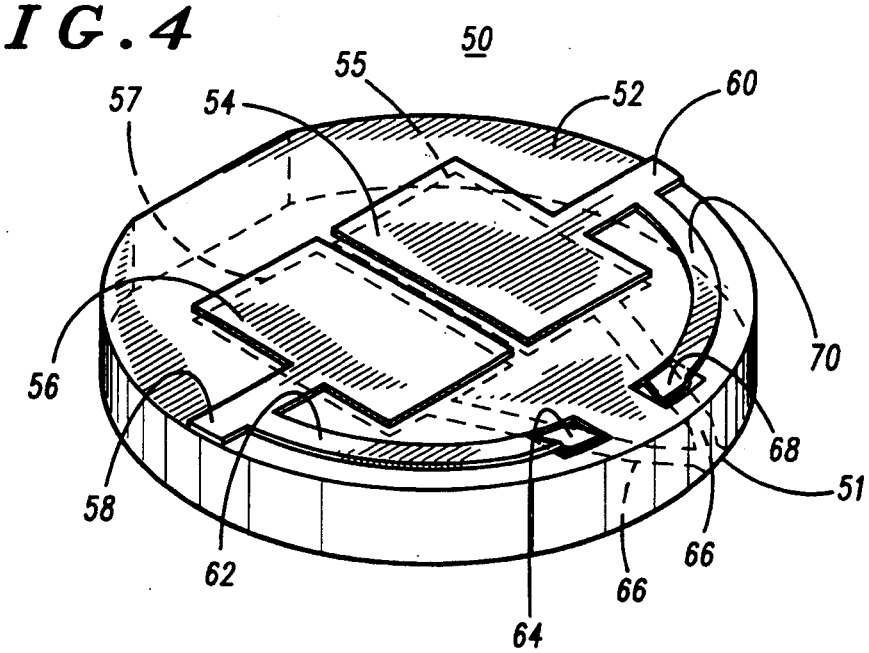
FIG. 6
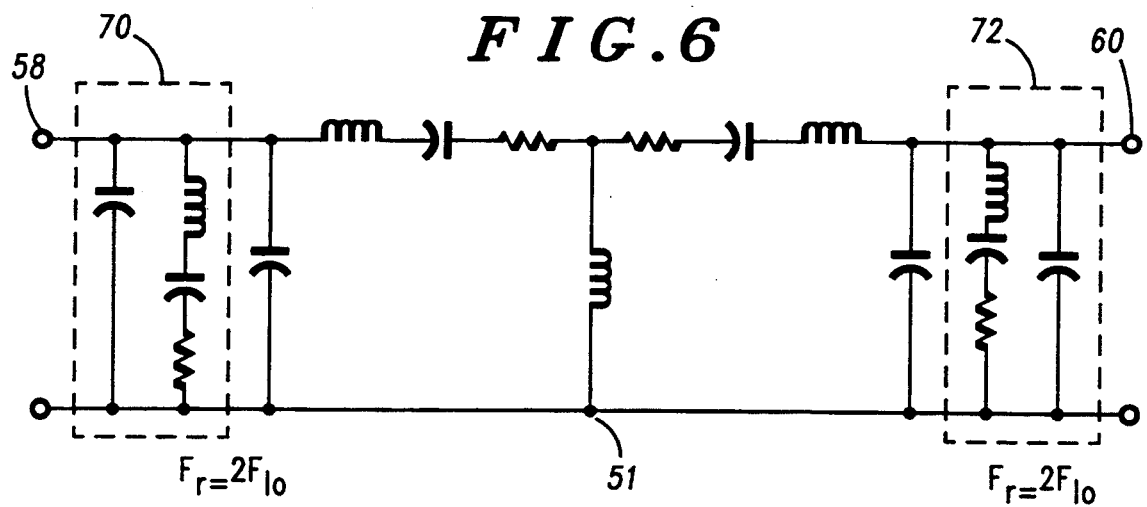
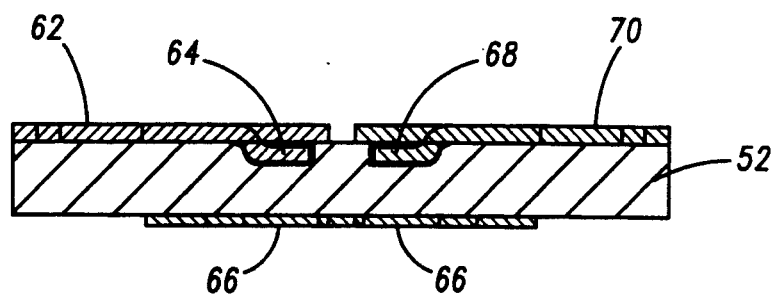
FIG. 7

TWO-POLE MONOLITHIC CRYSTAL FILTER INCLUDING SHUNT RESONATOR STAGES

FIELD OF THE INVENTION

This invention relates to monolithic crystal filters. More particularly this invention relates to monolithic crystal filters used in radio communication circuits.

BACKGROUND OF THE INVENTION

Monolithic crystal filters are well known in the radio communications art. FIG. 1 shows a top view of a prior art two-pole monolithic crystal filter (10).

The filter (10) shown in FIG. 1 is comprised of a single, piezoelectric substrate (12) which is typically quartz material. The upper and lower surfaces of the substrate (12) are usually planar and has on its upper surface planar electrodes (14 and 16) which comprise input and output nodes (2 and 3 respectively) of the filter (10).

These electrodes (14 and 16) form resonators with the addition of ground or reference electrodes (15 and 17) that are deposited on the opposite side of the substrate (12), directly below the upper surface electrodes (14 and 16). The reference electrodes are shown in FIG. 1 in the broken, and dashed lines. The reference potential electrodes are connected to a common reference potential node (19) which is also shown in broken lines indicating that it is on the opposite side of the substrate (12).

FIG. 2 shows the electrical equivalent circuit 20 for the two-pole monolithic filter (10) shown in FIG. 1. The input node in FIG. 2 is identified by reference numeral (2) and corresponds to the input node identified by the same reference numeral in FIG. 1. The output node shown in FIG. 2 is identified by reference numeral (3) and corresponds to the output node identified by the same reference numeral in FIG. 1. The reference potential node is identified in FIG. 1 and FIG. 2 by reference numeral 19.

The input resonator shown in FIG. 1 (comprised of electrodes 16 and 17) has an electrical equivalent shown in FIG. 2 that is comprised of a shunt capacitance (21) and a series inductance (22), a series capacitance (24) and a series resistance (26). The output resonator shown in FIG. 1, (comprised of electrodes 14 and 15) has an electrical equivalent shown in FIG. 2 as series resistance (22'), series capacitance (24') and series inductance (26') and shunt capacitance (21') identify the like elements of the other resonator stage. The shunt inductance (13) represents the acoustic coupling between the two resonator stages that is accomplished by means of the piezoelectric effect coupling the two resonator stages together through the substrate (12) shown in FIG. 1.

A problem with a two-pole monolithic piezoelectric filter, such as the device shown in FIG. 1, is that it may not provide enough signal attenuation for a particular radio frequency communications device. To increase the attenuation of intermediate frequency (IF) undesirable signals it has heretofore been the practice to use either a four-pole device, or to cascade two or more two-pole devices to provide a sufficiently steep frequency response for a radio communications application. Using four-pole or multiple two-pole devices to achieve a desired frequency rejection characteristic increases the size and cost of the filter or filters.

In FIG. 3, there is shown a representative plot of the attenuation of a single two-pole monolithic piezoelectric filter in the plot identified by reference numeral (32). Such a single two-pole device, which may not sufficiently attenuate input signals for a particular application, for instance, in dual-conversion receivers and at twice the frequency of the second local oscillator, as shown in FIG. 3. The trace shown in broken lines and identified by reference numeral (34) has a much sharper attenuation but it is at the expense of an additional two-pole of filtering and an overkill in cost, radio size and radio weight, if the only additional attenuation needed is at frequency of $F_c + 2F_{lo}$ where $F_{lo}$ is the second local oscillator frequency.

A piezoelectric filter device that provides an improved attenuation of input signal but that requires less volume than either multiple individual two-pole or four-pole piezoelectric filters would be an improvement over the prior art.

BRIEF DESCRIPTION OF THE DRAWINGS

FIG. 1 shows a top view of a prior art two-pole monolithic crystal piezoelectric filter.

FIG. 2 shows the equivalent circuit of the two-pole monolithic piezoelectric filter shown in FIG. 1.

FIG. 4 shows a top view of a two-pole monolithic filter and included shunt resonators on a single substrate.

FIG. 6 shows an equivalent circuit diagram of the apparatus shown in FIG. 4.

FIG. 7 shows a cross-sectional view of the additional shunt resonators shown in FIG. 4.

DESCRIPTION OF A PREFERRED EMBODIMENT

Figure 3:
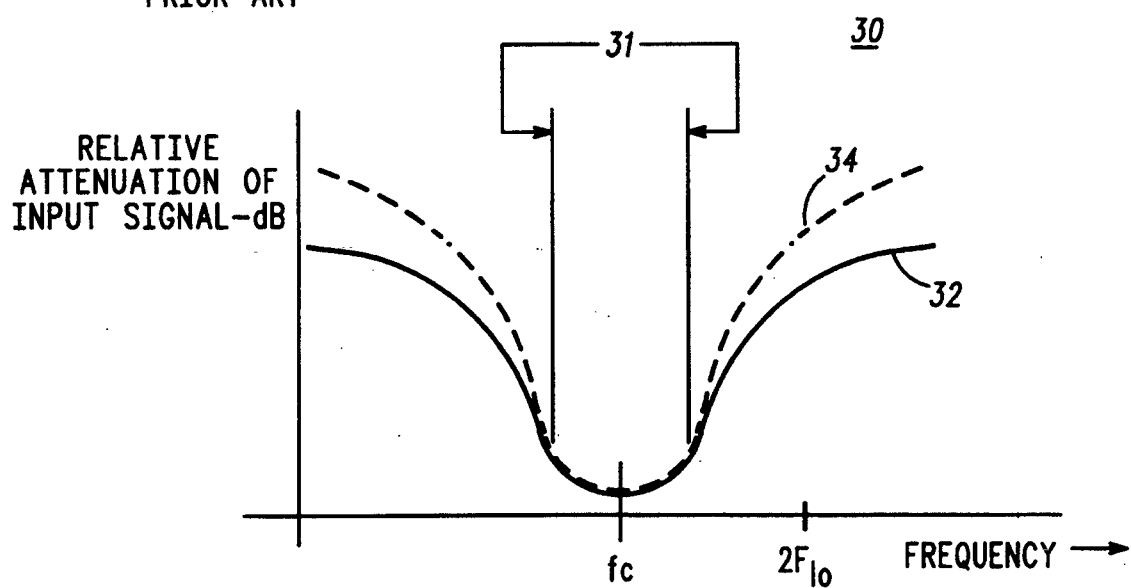
FIG. 3 shows a representative plot of two-pole and four-pole piezoelectric filters.

Referring to FIGS. 2 and 3, it can be seen that if the objective of the piezoelectric filter is to increase the attenuation of the input signal at specific frequencies above the center frequency yet retain the bandwidth and bandwidth characteristics of the filter (31), such an increased attenuation can be accomplished by the addition of one or more shunt resonator stages at at least the input and perhaps the output of the two-pole monolithic filter shown in FIG. 6. These shunt resonators are of substantially higher impedance than the resonators comprising the two-pole monolithic filter (due to the smaller electrode size) and as such they do not interfere with the behavior of the pass band 31' of the two pole filter while providing the needed attenuation at their resonance which typically is at two-times the frequency of the second local oscillator. (A shunt filter stage is considered to be tuned circuit coupled between the input node and ground or the reference potential.) Addition of a shunt filter element provides a transmission zero to the transfer function of the filter and is preferably accomplished by the addition of a resonator device on the same substrate (52) thereby precluding the need for additional filter stages that require additional volume and add parts count to a radio communications device. An additional zero in the frequency response transfer function of the filter can be accomplished if an additional resonator is added to the monolithic piezoelectric quartz substrate (52) in such a way that it is not acoustically coupled into either the input resonator (56) or the output resonator (54) but yet provides a shunt path to ground of signals that are desired to be attenuated.

Referring now to FIG. 4 there is shown an improved monolithic piezoelectric filter (50) that is comprised of a piezoelectric substrate (52). This filter (50) of course has an input node identified by reference numeral (58), an output node that is identified by reference numeral (60) and a filter reference potential node identified by reference numeral (51).

The filter (50) has a first resonator stage or input resonator stage that includes a first signal electrode (56) and a corresponding reference potential electrode shown in FIG. 4 in broken lines and identified by reference numeral 57. The first electrode (56) and its opposite and corresponding reference potential electrode (57) together comprise a piezoelectric resonator inasmuch as the substrate (52) is a piezoelectric material, typically quartz.

An output or second resonator stage is comprised of a second signal electrode (54) and corresponding ground or reference potential electrode shown in broken lines and identified by reference numeral (55). Together this signal electrode (54) and its electrode (55) comprise the second output resonator stage.

The first or input resonator stage comprised of electrodes (56 and 57) is electrically connected and coupled to the input node (58) by means of metalization deposited on to the surfaces of the electrode. The output resonator stage comprised of electrodes (54 and 55) is coupled to the filter output node (60) by means of the metalization coupling the region identified by reference numeral (60) to the metalization identified by reference numeral (54 and 55).

Figure 5:
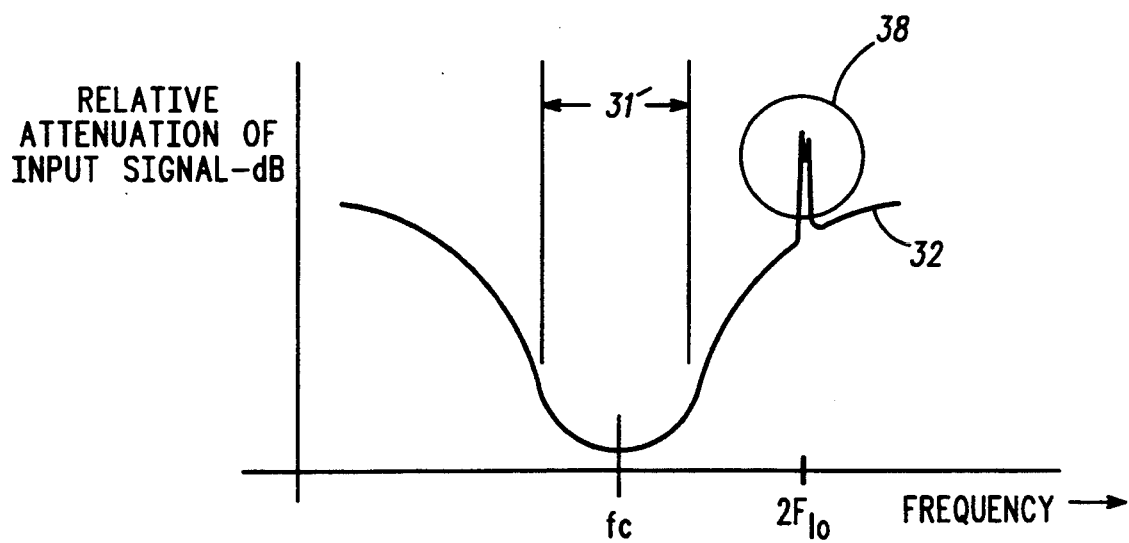
FIG. 5 shows a plot of the attenuation of the device shown in FIG. 4.

The improvement in the frequency response of the filter, which response is shown in the broken line identified by reference numeral (38) and shown in FIG. 5 is accomplished by means of at least one additional resonator stage on the same substrate (52) which additional resonator is acoustically isolated from both the first and second resonator stages but electrically shunting signals at its resonance frequency, between the input node (58) and the ground or reference potential (51).

An additional, third resonator stage is provided on the substrate that is acoustically isolated from the first and second resonator stages by a metalization area identified by reference numeral 64 as shown. This metalization area identified by reference numeral 64 is physically opposite metalization on the under side that comprises the ground or reference potential electrode (66) as shown in FIG. 4. This third resonator stage (64) is coupled to the input node (58) by means of a metalization trace identified in FIG. 4 by reference numeral 62. The electrical equivalent of this third resonator stage is shown in FIG. 6 and identified by reference numeral (70). Since the metalization comprising this third resonator stage is acoustically removed from both the first and second resonator stages, it effectively provides an additional resonant circuit coupling signals of a particular frequency of interest to ground or the raw potential (51).

Yet additional signal filtering can be accomplished if a fourth additional resonator stage is added between the filter output node to ground (51). This additional resonator stage is provided by the metalization (68) that is deposited opposite the metalization on the under side of the substrate that couples the electrodes (55 and 57) to the ground or reference potential (51). Signals are coupled into this additional resonator by means of the metalization deposited on the upper surface and identified by reference numeral (70).

Referring to FIG. 5 there is shown a representative plot of the frequency response of the filter shown in FIG. 4 as it is modified by the addition of the two resonator stages (64 and 68). These two resonator stages will, if properly selected, provide for the increased attenuation in the region identified by reference numeral 38 (typically this frequency being at a frequency twice the frequency of the second local oscillator).

Accordingly, the frequency attenuation shown in FIG. 5 and identified by reference numeral (38), which roughly corresponds to a frequency twice that of the second local oscillator, can be such that it exceeds the attenuation provided by a four-pole filter section or two cascaded two-pole sections.

The equivalent circuit of the monolithic filter device shown in FIG. 4 is depicted in FIG. 6. Reference numerals (70 and 72) identify the electrical equivalent of the resonator stages (64 and 68) shown in FIG. 4. Reference numeral (51) identifies the ground potential and reference numerals (58 and 60) show the input and output terminals respectively.

Referring to FIG. 7 there is shown a cross-sectional view of the substrate (52) of the device shown in FIG. 4. Of particular note is that the resonator stages (64 and 68) comprised of metalization deposited into recesses formed into the substrate (52). These recesses can be formed by photochemical etching or other appropriate processes. Such recesses are necessary to reduce the thickness of the piezoelectric substrate; this thickness reduction will increase the unplated resonant frequency of this region of the substrate in such a way that when metalization electrodes are deposited to form resonators (64 and 68), their resonant frequencies are at or near the desired frequencies, typically a frequency substantially equal to twice the frequency of the second local oscillator, at shown in FIG. 6 and on FIG. 5.

Reference numerals (62 and 70) depict the metalization identified by like numerals in FIG. 4. Similarly, reference numeral (66) shows the metalization deposited on the under side or lower side of the substrate (52) and is the ground or reference potential for the resonator stages.

It should be evident from the foregoing description of the preferred embodiment of the invention that an improvement in the attenuation response of a two-pole monolithic crystal filter can be achieved at specific frequencies above the center frequency of the filter, while using only a single substrate by the inclusion of acoustically isolated resonator stages that shunt particular frequency signals to ground. Those skilled in the art will recognize that the actual location and placement of these additional resonator stages will be application specific and can be determined by either empirical means or by appropriate quartz modeling equations.

What is claimed is:

1. A monolithic piezoelectric filter comprised of:
   a piezoelectric substrate;
   a filter input node and a filter output node and a filter reference potential node;
   a two-pole monolithic filter on said substrate comprised of:
      first and second resonator stages comprised of electrodes deposited onto said piezoelectric substrate, said first resonator stage coupled to said filter input node and said reference potential node, said second resonator stage coupled to said filter output node and said reference potential node, said first and second resonator stages being acoustically coupled to each other; and a third resonator stage on said substrate substantially acoustically isolated from both said first and second resonator stages, said third resonator stage having an input and an output, said input of said third resonator stage coupled to one of said filter input node and said filter output node, said output of said third resonator stage coupled to said filter reference potential node, defining a shunt path of a signal to be attenuated from either the filter input node to the reference potential node, the filter output node to the reference potential node or both.

2. A monolithic piezoelectric filter comprised of:

a piezoelectric substrate;

a filter input node and a filter output node and a filter reference potential node;

a two-pole monolithic filter on said substrate comprised of:
first and second resonator stages comprised of electrodes deposited onto said piezoelectric substrate, said first resonator stage coupled to said filter input node, said second resonator stage coupled to said filter output node, said first and second resonator stages being acoustically coupled to each other;

a third resonator stage on said substrate substantially acoustically isolated from both said first and second resonator stages, said third resonator stage having an input and an output, said input of said third resonator stage coupled to one of said filter input node and said filter output node, said output of said third resonator stage coupled to said filter reference potential node, defining a shunt path of a signal to be attenuated from either the filter input node to the reference potential node or the filter output node to the reference potential node; and a fourth resonator stage on said substrate, substantially acoustically isolated from said first, second, and third resonator stages and having an input and an output, said input of said fourth resonator stage coupled to the other one of said filter output node and said filter input node, not coupled to said third resonator stage, said output of said fourth resonator being coupled to said filter reference potential, defining a second shunt path of a signal to be attenuated.

3. The monolithic piezoelectric filter of claim 2 wherein at least one of said third and fourth resonator stage is comprised of recesses formed into the piezoelectric substrate.

4. The monolithic piezoelectric filter of claim 3 wherein said recesses formed into the piezoelectric substrate are metalized.

5. The monolithic piezoelectric filter of claim 1 wherein said piezoelectric material is quartz.

6. A monolithic piezoelectric filter comprised of:

a piezoelectric substrate;

a filter input node and a filter output node and a filter reference potential node;

a two-pole monolithic filter on said substrate comprised of:
first and second resonator stages comprised of electrodes deposited onto said piezoelectric substrate, said first resonator stage coupled to said filter input node, said second resonator stage coupled to said filter output node, said first and second resonator stages being acoustically coupled to each other;

a third resonator stage on said substrate substantially acoustically isolated from both said first and second resonator stages, said third resonator stage having an input and an output, said input of said third resonator stage coupled to one of said filter input node and said filter output node, said output of said third resonator stage coupled to said filter reference potential node, defining a shunt path of a signal to be attenuated from either the filter input node to the reference potential node or the filter output node to the reference potential node;

a fourth resonator stage on said substrate substantially acoustically isolated from said first, second, and third resonator stages and having an input and an output, said input of said fourth resonator stage coupled to the other one of said filter output node and said filter input node, not coupled to said third resonator stage, said output of said fourth resonator being coupled to said filter reference potential, defining a second shunt path of a signal to be attenuated, said third and fourth resonator stages having electrode sizes smaller than the electrodes of said first and second resonator stages.

* * * * *